United States Patent
Ni et al.

(10) Patent No.: US 9,136,839 B2
(45) Date of Patent: Sep. 15, 2015

(54) POWER SWITCH

(71) Applicant: Wenzhou MTLC Electric Appliances Co., Ltd., Yueqing, Zhejiang (CN)

(72) Inventors: Lidong Ni, Yueqing (CN); Wei Gao, Yueqing (CN)

(73) Assignee: Wenzhou MTLC Electric Appliances Co., LTD., Yueqing, Zhejiang (CN)

( * ) Notice: Subject to any disclaimer, the term of this patent is extended or adjusted under 35 U.S.C. 154(b) by 160 days.

(21) Appl. No.: 13/747,344

(22) Filed: Jan. 22, 2013

(65) Prior Publication Data
US 2014/0203664 A1    Jul. 24, 2014

(51) Int. Cl.
*H03K 17/94* (2006.01)

(52) U.S. Cl.
CPC ............ *H03K 17/941* (2013.01); *Y10T 307/773* (2015.04)

(58) Field of Classification Search
CPC .............................. H03K 17/941; H01M 2/10
USPC ........ 307/117; 361/173–179, 679.01–679.45, 361/679.55–679.61, 724–727, 728–747, 361/752–759, 796–837; 315/294, 295, 308, 315/291, 219, 307, 361, 158; 312/223.2, 312/7.1, 319.9, 333, 348.3, 222, 226
See application file for complete search history.

(56) References Cited

U.S. PATENT DOCUMENTS

| | | | | |
|---|---|---|---|---|
| D380,452 S | * | 7/1997 | Mix et al. | D13/171 |
| 5,730,617 A | * | 3/1998 | Araki et al. | 439/374 |
| 6,250,954 B1 | * | 6/2001 | Kasai | 439/501 |
| 6,369,688 B1 | * | 4/2002 | Abe et al. | 337/299 |
| D656,849 S | * | 4/2012 | Ni et al. | D10/70 |
| 2009/0095889 A1 | * | 4/2009 | Bender et al. | 250/221 |
| 2011/0253516 A1 | * | 10/2011 | Figueroa et al. | 200/297 |
| 2012/0237813 A1 | * | 9/2012 | Shi et al. | 429/100 |
| 2014/0203664 A1 | * | 7/2014 | Ni et al. | 307/117 |

* cited by examiner

*Primary Examiner* — Courtney Smith
*Assistant Examiner* — Rashen E Morrison
(74) *Attorney, Agent, or Firm* — Ziegler IP Law Group, LLC.

(57) ABSTRACT

A switch assembly includes a switch cover and a switch base. The switch cover fixedly couples to the switch base with engagement protrusions integrally defined in the switch cover and corresponding apertures defined within the switch base without fasteners or requiring tools. From a disassembled configuration, the cover couples to the switch base by aligning cover protrusions with corresponding base apertures, pressing the cover against the base, sliding the cover in a first engagement direction, and locking the cover protrusions into the apertures by applying a threshold level of engagement force in an engagement direction. From an assembled configuration, the cover de-couples from the switch base by applying a threshold level of disengagement force in disengagement direction oppositely oriented with respect to the engagement direction, thereby unlocking the cover protrusions from the base apertures.

10 Claims, 7 Drawing Sheets

POWER SWITCH

FIELD

Aspects of the present disclosure relate to low-voltage switching and low voltage switch assemblies. More specifically, aspects of the present disclosure relate to a low voltage switch assembly having a cover plate that is attachable and detachable without fasteners or tools.

BACKGROUND

Conventional switch assemblies include a switch base and a switch cover. In typical switch assembly installations, the switch base is mounted within a wall opening. The cover attaches to an exposed surface of the switch base, and may cover a portion of the switch base or cover the entire switch base as well as cover any gap between the switch base and wall opening, thereby providing a 'clean' and aesthetically pleasing switch assembly installation. Typically, in such installations, the switch cover attaches to the switch base by way of fasteners. These fasteners may include one or more screws extending through the switch cover that are received within the switch base assembly.

Securing switch covers with fasteners poses several problems. First, removal of such switch covers therefore necessary entails first obtaining a tool adapted for the fasteners used to secure the cover, such as an appropriately sized screw driver having the proper configuration (i.e. flat head, Phillips, Torx, etc.). Second, the fasteners need by safeguarded after removal such that they are available once the switch cover has be put back into place or replaced with another cover. This can be problematic as the fasteners are typically small, and readily misplaced—and for this reason some replacement switch covers also come with a redundant fastener set in the cover packaging. Finally, the fasteners require proper installation. For example, covers secured with threaded fasteners (screws) require that the screw fasteners not be cross-threaded and that the screws themselves by tightened an appropriate amount—tight enough to be secured and/or accommodate any flatness flaws over the area bridged by the cover, but not so tight that the cover excessively deforms or cracks.

There is therefore a need for switch assembly having a cover that attaches to the switch base without requiring tools. There is a further need for a switch assembly having a cover securable to the switch base without fasteners. Finally, there is a need for switch assembly cover that securably couples to the switch base without tools or fasteners, yet is readily removable in the event that switch installation need be serviced or the cover replaced.

BRIEF DESCRIPTION OF EMBODIMENTS

An exemplary embodiment of a switch assembly is described. The switch has a base with a top plate receiving surface and a cover with an engagement surface. The cover also has an integral protrusion coupled to the engagement surface and the base has a corresponding aperture configured to fixedly engage the cover integral protrusion.

An exemplary method of attaching a switch cover the switch base assembly is described. The method includes the operations of aligning the cover over the base such that the cover protrusions align to the base apertures. The protrusions are then downwardly pressed into corresponding apertures such that a portion of the cover engagement surface conforms to the top plate receiving surface, and the cover slid along the top plate in a longitudinal direction such that the cover releasably couples to the top plate. In an embodiment of the method, the switch cover lockably and releasably couples to the switch top plate.

An exemplary embodiment is described. The switch has a base with a top plate receiving surface and a cover with an engagement surface. The cover also has four integral protrusions symmetrically disposed on the cover engagement surface, two of which have lobbed tabs. The base has four corresponding apertures, two of which are configured to lockably engage the lobbed tabs using an interior contour of the base top plate.

BRIEF DESCRIPTION OF THE DRAWINGS

The foregoing and other advantages and features of the invention will become apparent upon reading the following detailed description and upon reference to the drawings in which.

DETAILED DESCRIPTION OF SPECIFIC EMBODIMENTS

Detailed illustrative embodiments are disclosed herein. While specific configurations and arrangements of switch assembly, switch base, and switch cover are described herein, it should be understood that these are for illustrative purposes and non-limiting. A person skilled in the pertinent art will appreciate that other configurations and arrangements of the can be used without departing from the spirit and scope of the present description.

It will further be understood that, although the terms first, second, top, and bottom are used herein to describe certain elements, these elements should not be limited by these terms. These terms serve only used to distinguish elements from another. For example, a first element could be termed a second element, and, similarly, a second element could be termed a first element, without departing from the scope of example embodiments. As further used herein, the term "and/or" includes any and all combinations of one or more of the associated listed items.

Figure 1:
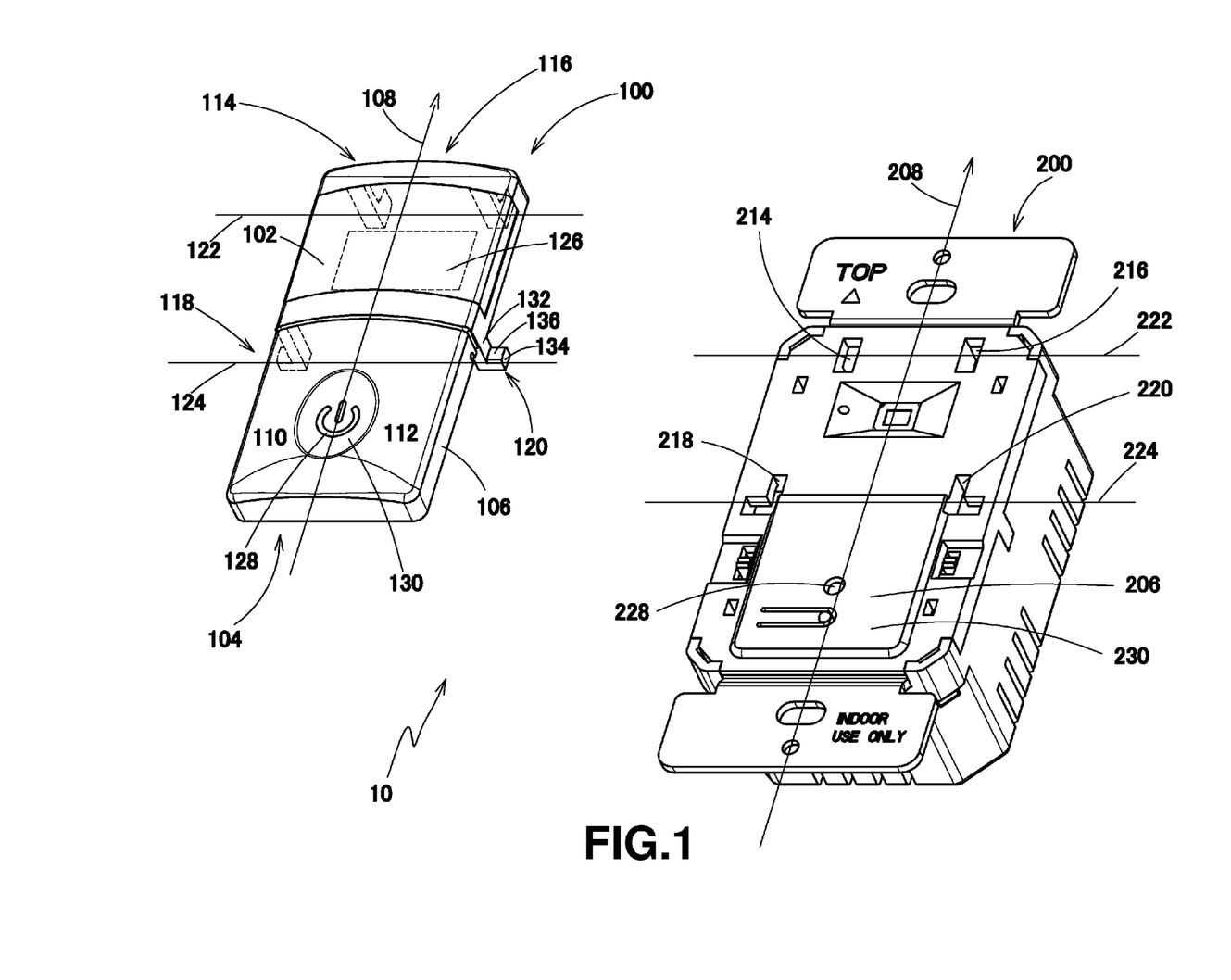
FIG. 1 is a perspective view of a switch assembly in a disassembled configuration.

FIG. 1 shows a perspective view of an exemplary embodiment of a switch assembly 10 in a disassembled configuration. Switch assembly 10 is illustrated in its disassembled configuration, and comprises a switch cover 100 and switch base 200. Switch assembly 10 further comprises an assembled configuration wherein the switch cover 100 is releasably coupled to the switch base 200.

Cover 100 has an upper surface 102 and an engagement surface 104. The upper surface 102 is on an opposite side of cover 100 from the engagement surface 104. Cover 100 further comprises an edge 106 having a thickness extending about the cover periphery of the cover. Cover 100 also has a longitudinally extending axis 108 that divides the both surfaces into first and second portions, the engagement surface first and second portions (110, 112) being identified in the figure.

Cover 100 further comprises a plurality of protrusions. In the illustrated embodiment, cover 100 comprises a first protrusion 114 (illustrated in phantom lines), a second protrusion 116 (phantom lines), a third protrusion 118 (phantom lines), and a fourth protrusion 120. The protrusions (114, 116, 118, 120) are distributed across the cover engagement surface 104, the first and third protrusions (114, 118) being disposed on the first portion 110 of the surface and second and fourth protrusions (116, 120) being disposed on the second portion 112 of the surface. First and second protrusions (114, 116) each define a longitudinally-extending tab disposed under the engagement surface, the tabs being arranged on a cover first lateral axis 122, axis 122 being orthogonal to axis 108. Third and fourth protrusions (118, 120) each define a laterally-extending tab disposed under the engagement surface, the tabs being arranged on a cover second lateral axis 124, axis 124 being orthogonal to axis 108. In an exemplary embodiment, the cover 100 and projections (114, 116, 118, 120) are integrally constructed—integral as used herein meaning that the protrusions are permanently affixed to the cover so as a form a single structure. The cover may be constructed from a plastic or other elastomer material, and in an exemplary embodiment comprises and elastic structure having resiliently deformable between a first planar configuration (shown in FIG. 1) and second bowed configuration wherein the cover has a concave or convex contour (not shown). In an embodiment, cover 100 has convex profile when viewed from edge 106 in its first configuration (e.g. normally bowed).

In an exemplary embodiment, at least one of the protrusions 120 comprises a first segment 132 coupled to the cover engagement surface extending downwardly therefrom, and a second segment 134 extending laterally (and parallel with respect to the engagement surface) therefrom. The second segment is coupled to the first segment, and in an exemplary embodiment comprises a tab having longitudinally-disposed lobe 136 having a cross-section with an arcuate segment (shown in FIG. 2B).

Base 200 comprises a body 202 and a top plate 204. Top plate 204 is coupled to the body 202 such that the body and top plate form a single structure configured to house electrical switching equipment. Top plate 204 further comprises an exterior surface 206 and an oppositely arranged interior surface (not shown). In an exemplary embodiment, exterior surface 206 has a substantially planar (flat) portion and the interior surface has a surface portion having a contour. Top plate 204 also has a longitudinal axis 208, axis 208 dividing the exterior surface 206 into a first surface portion 210 and a second surface portion 212. Top plate 204 also has an edge extending about the periphery of the plate and a thickness.

Top plate 204 further comprises a plurality of apertures. In the illustrated embodiment, top plate 204 comprises a first aperture 214, a second aperture 216, a third aperture 218, and a fourth aperture 220. Apertures (214, 216, 218, 220) extend into the top plate surface, and in an exemplary embodiment extend define keyways between the environment external to the base and an interior of the base. Apertures (214, 216, 218, 220) are distributed across the top plate 204, first and third apertures (214, 218) being disposed on the first portion 210 of the surface and second and fourth protrusions (216, 220) being disposed on the second portion 212 of the surface. First and second apertures (224, 226) each define a longitudinally-extending keyway in top plate 204, the keyways being substantially parallel and bisected by a top plate first lateral axis 222, axis 222 being orthogonal to axis 208. Third and fourth apertures (218, 220) each define a laterally-extending keyway coupled with a longitudinally-extending keyway, the apertures being arranged on a top plate lateral axis 224, axis 224 being orthogonal to axis 208. In an exemplary embodiment, first and second apertures are substantially rectangular-shaped and third and fourth apertures are substantially L-shaped. The L-shaped apertures are arranged such the shorter legs are disposed laterally on the top plate surface, orthogonal with respect to axis 208, and the longer legs run longitudinally, parallel with respect to axis 208. In an exemplary embodiment the respective longitudinal portions of the apertures (214, 216, 218, 220) have a common length.

In an exemplary embodiment, the base 200 comprises at least one of a passive infra-red (PIR) power switch 226, a lamp 228, and a switch 230. At least a portion of the at least one PID, lamp, or switch is incorporated into the base top plate 204 and has a portion of the feature disposed on the top plate surface. Lamp 228 may be a light emitting diode (LED) and switch 230 may be an on/off switch. In an exemplary embodiment, the cover 100 comprises at least one of a lens 126, a cover portion 128 configured to transmit light received at the cover engagement surface 104, and a cover portion 130 configured to convert user contact with the cover surface to a toggling of an underlying on/off switch. Lens 126 may be a Fresnel lens. Cover portion 128 may be an aperture or a lenslet. Cover portion 130 may be an elastic material more readily deformable than the remainder of cover 100. In an embodiment, the indicator and switch are an integrated 2 in 1 assembly on each of the switch cover and the switch base where an LED and on/off switch are co-located on the switch assembly.

Figure 2:
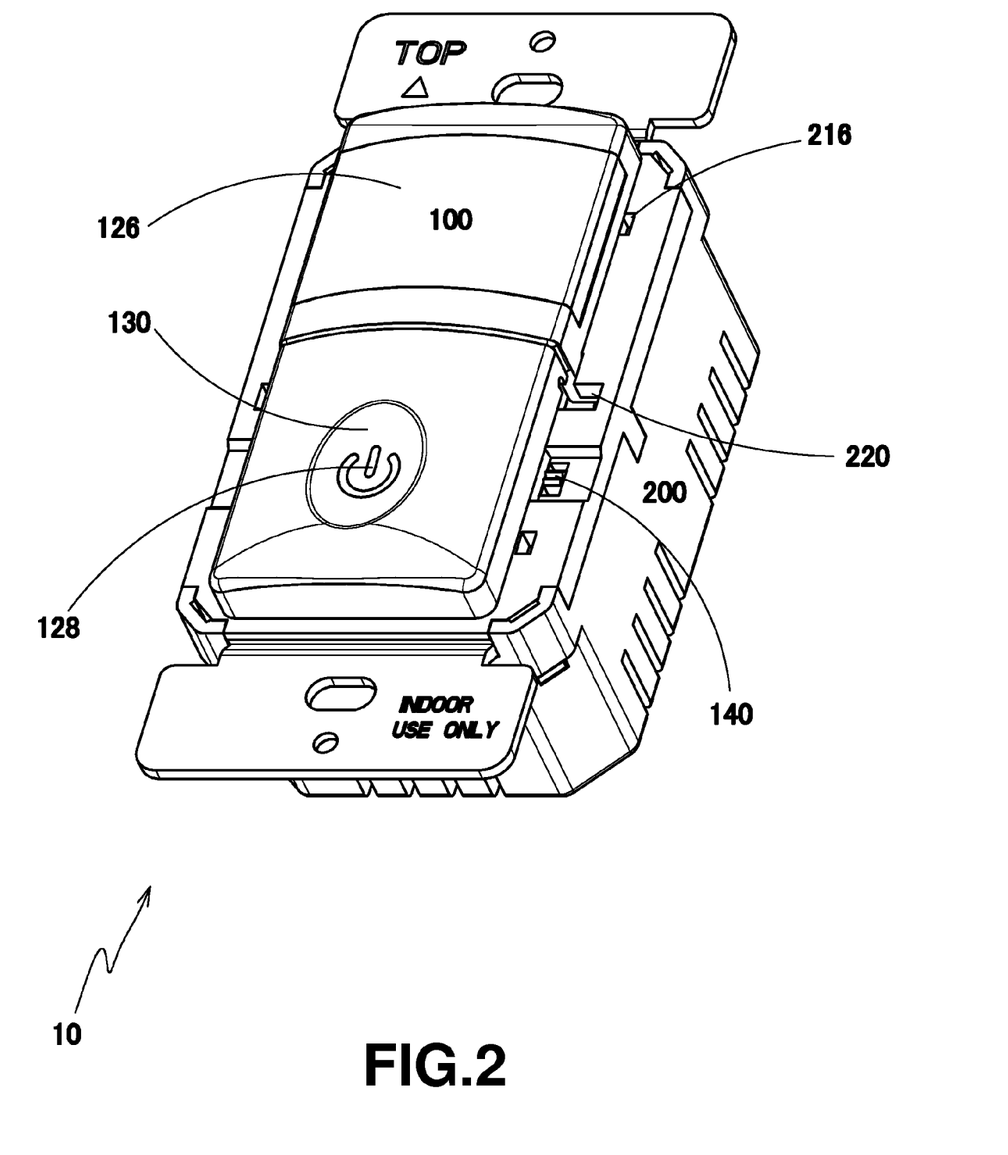
FIG. 2 is a perspective view of a switch assembly in an assembled configuration.

FIG. 2 shows a perspective view of an exemplary embodiment of a switch assembly 10 in an assembled configuration. A user assembles switch assembly 10 aligning the corresponding cover protrusions with base apertures. The user then pushes the switch cover in a first direction such that the cover engagement surface approaches and/or contacts the base top plate exterior surface such that respective base apertures receive corresponding cover protrusions. In an embodiment where the one of the cover engagement surface and top plate exterior surface have different contours (e.g. the base top plate exterior surface is planar and the cover engagement surface is convex), this operation further comprises being the cover such the cover engagement surface conforms to the top plate exterior surface. Finally, the user slides the cover in a second direction, thereby fixing the cover to base by positioning a portion of at least one of an L-shaped cover protrusions such that the cover top plate is between the protrusion portion and the cover. Advantageously, in an embodiment having at least one the infra-red lens 126 and infra-red detector power switch 226, visible light lens 128 and light source 228, and toggle switch cover 130 and toggle switch 230, the aperture lengths are sized such that movement in the second directions align the corresponding cover and base elements (126/226, 128/228, 130/230).

In the embodiment shown in FIG. 2, switch assembly 10 further comprises a second switch 140. Switch 140 is integrated into the switch base 200 and is positioned outside of the periphery of the switch cover 100 when fixed to base 200. Advantageously, positioning switch 140 outside of the footprint of the cover allows a user to operate the switch without having to remove cover 100. In an embodiment, switch 140 is a manual electric switch packaged with at least one other switch in a group in a standard dual in-line (DIP) package. In the illustrated embodiment, switch base 200 is configured to receive a second decorative switch cover that covers switch 140 and extends from the periphery of switch cover 100 to beyond the footprint of the switch base 200.

Figure 3A:
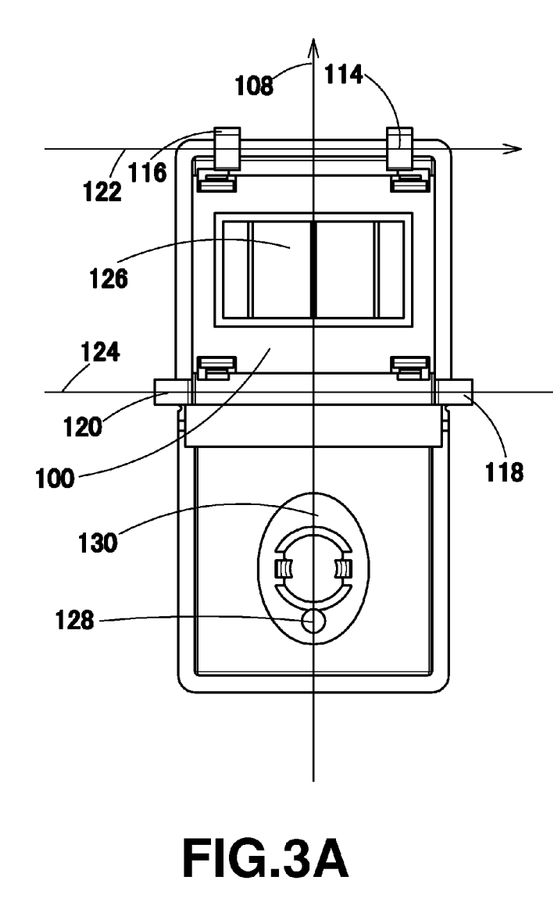
FIG. 3A is a plan view of a switch cover.

FIG. 3A is a plan view of an embodiment of cover 100 looking toward engagement surface 104. As shown in the illustrated embodiment, the second segments of third and fourth protrusions (118, 120) extend beyond the edge of the cover 100 laterally. As also shown in the figure, the second segments of the first and second protrusions (114, 116) also extend beyond the edge of cover 100 longitudinally.

Figure 3B:
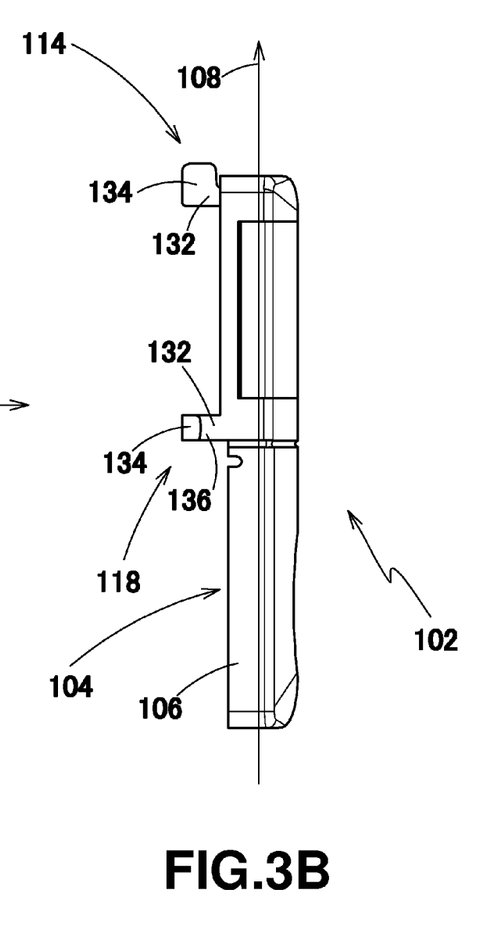
FIG. 3B is a profile view of a switch cover.

FIG. 3B is a cross-sectional view of an embodiment of cover 100 as seen looking toward the cover edge 106. In the illustrated embodiment, the laterally-extending second segment 134 of fourth protrusion 118 defines a longitudinally-extending lobe. The lobe has a cross-sectional profile with an arcuate portion 136. In an exemplary embodiment, the laterally-extending portion of the third protrusion 118 has a longitudinally-extending lobe with a cross-sectional profile defining an arcuate portion (not shown).

Figure 4:
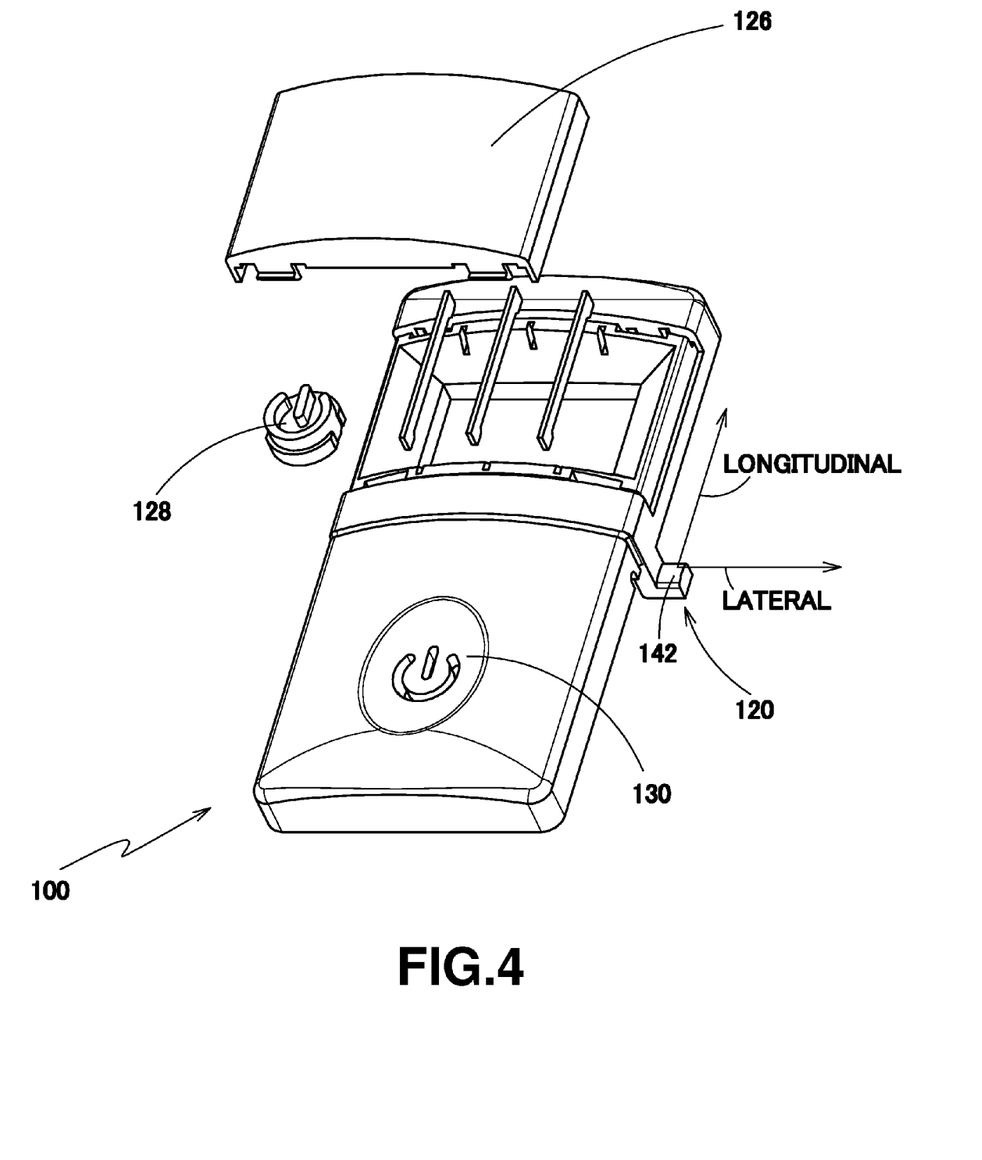
FIG. 4 is an exploded view of an embodiment of a switch cover.

FIG. 4 is an exploded view of an embodiment of a switch cover 100. The switch cover has an infra-red lens 126, an indicator 128, and a cover portion 130 movable to engage and underlying on/off switch. In the illustrated embodiment, cover portion 130 and indicator 128 are integrated into a 2 in 1 switch. As further shown in the figure, at least one of the cover protrusions has an L-shaped cross-section extending when viewed along the longitudinal axis (e.g. a lateral L-shaped cross-section). Advantageously, the laterally-extending L-shaped cross-section enables the above-described movement of the cover in second direction to position a lobed portion of the protrusion 142 against receiving contour on the interior surface of the switch top plate through movement within a corresponding L-shaped base top plate aperture (shown in FIG. 6 and FIG. 7). In the illustrated embodiment, the cover has a non-planar cover upper surface contour.

Figure 5:
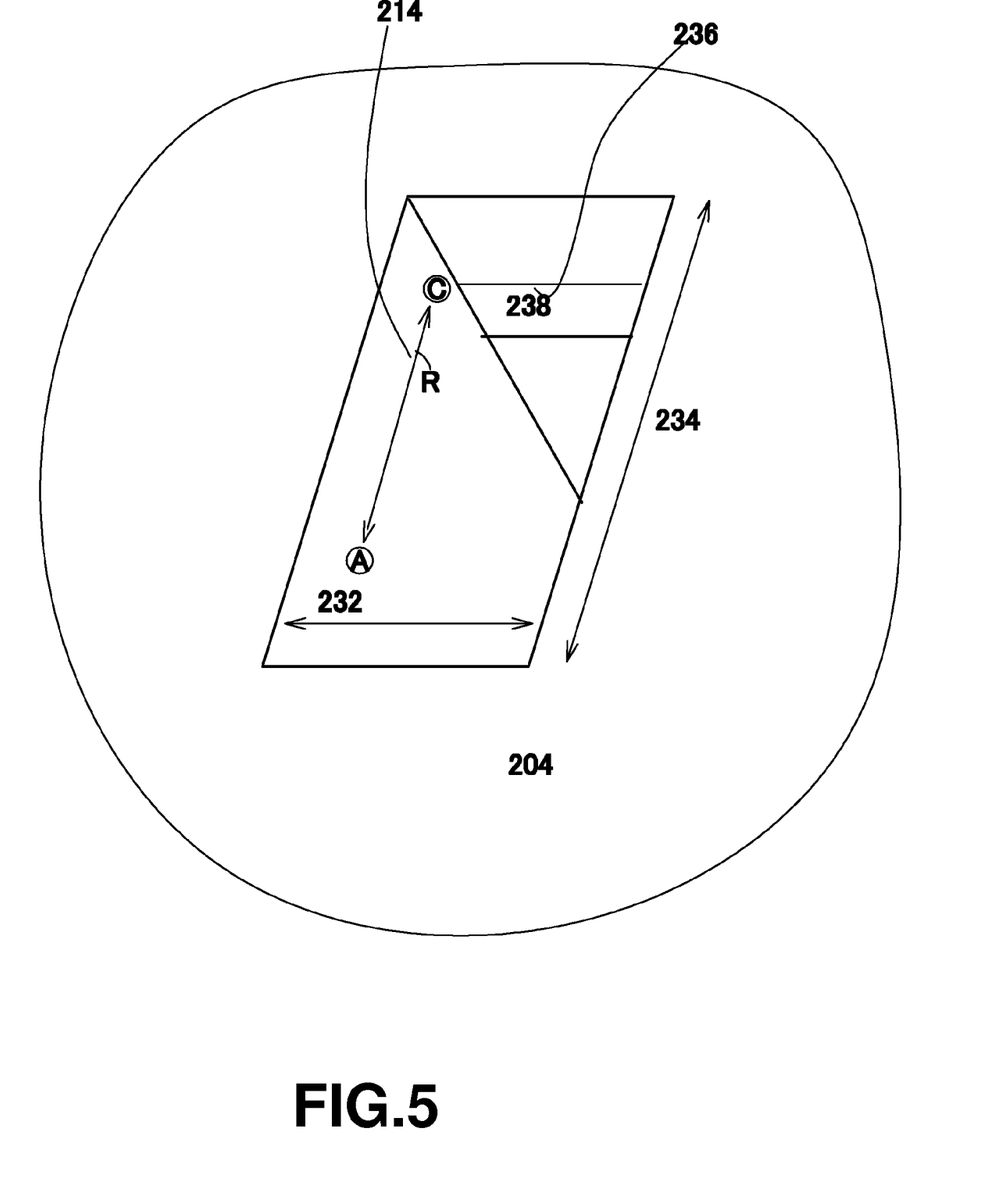
FIG. 5 shows an exemplary aperture disposed in the switch base top plate.

FIG. 5 shows a portion of top plate 204 and first aperture 214. As shown in the figure, aperture 214 comprises a width 232 and a length 234. Width 232 may be same as a lateral width of the first protrusion 114. Width 232 extends in the lateral direction, orthogonally with respect to the top plate axis (not shown) and length 234 extends longitudinally, parallel with respect to the top plate axis, thereby defining a rectangular shape.

The interior surface of top plate surface 236 defines a recess 238 configured to receive at least a portion of the second segment of the first cover protrusion 114. In an exemplary embodiment, a cross-section of recess 238 substantially conforms to a cross-section of the second segment of the first protrusion. Advantageously, constructing aperture 214 as shown in FIG. 3 allows the cover 100 to couple to base 200 by (i) aligning the cover such that first protrusion 114 is positioned over a location A, (ii) pressing the cover in a downward direction, such that both protrusion segments (132, 134) are received within the aperture, and (iii) sliding the cover longitudinally in the direction of an arrow B such that the first segment 132 occupies location B—thereby releasably positioning at least a portion of the second segment 134 in recess 238. As would be appreciated by one of skill in the art in view of the description herein, configuring second aperture 216 and second protrusion 116 may be constructed to comprise similar features and like functionality. Advantageously, embodiments of cover 100 and base 200 having protrusions (114, 116) and corresponding apertures (224, 226) configured as described herein provides a method of coupling cover 100 to base 200 using operations (i), (ii), and (iii) to releasably couple parts using a plurality of corresponding protrusions in a single longitudinal motion. Moreover, cover 100 may be decoupled from base 200 using a single, oppositely-directed, longitudinal motion.

Figure 6:
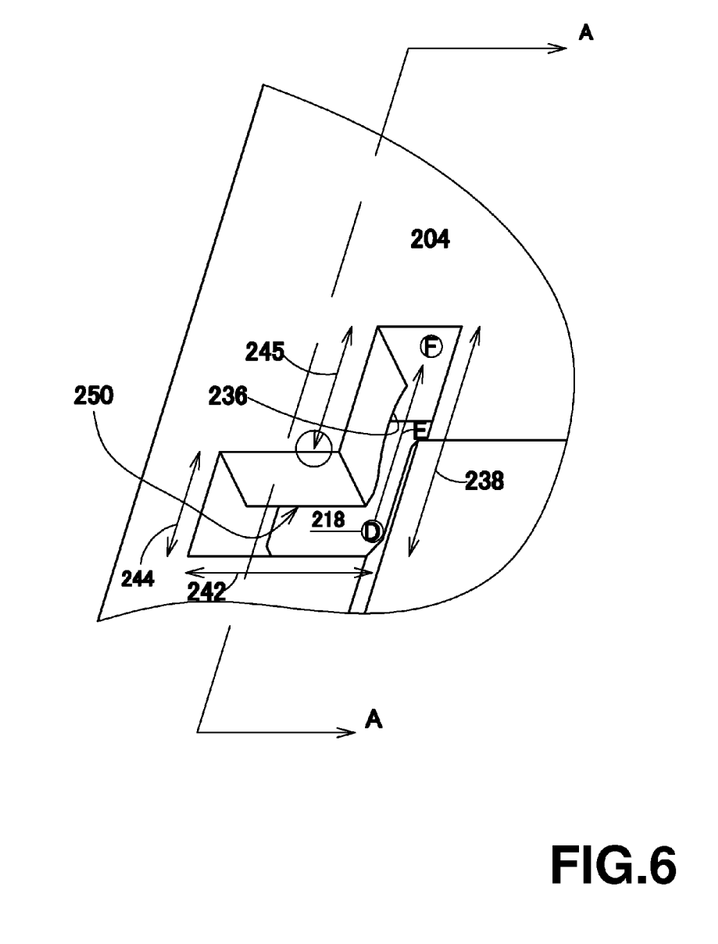
FIG. 6 shows another exemplary aperture disposed in the switch base top plate.

FIG. 6 shows a portion of top plate 204 and third aperture 218. Aperture 218 comprises a longitudinal slot having a length 238 and a lateral slot having a length 242 and a width 244. In an embodiment, slot width 244 is about the same as the width of the first and second segments of protrusion 118. Slot length 242 extends laterally, and is orthogonal with respect to the top plate axis (not shown), and slot length 238 extends longitudinally, parallel to the top plate axis. The lateral and longitudinal slots are coupled at an end, thereby forming an L-shaped slot with length 236 being greater than that of length 242.

The interior surface of top plate surface 236 defines a recess 250 configured to receive and lock in position at least a portion of the second segment of third protrusion 118. In an exemplary embodiment, a cross-section of recess 250 substantially conforms to a cross-section of the second segment of third protrusion 118. Advantageously, constructing aperture 218 as shown in FIG. 4 allows cover 100 to couple to base 200 during the above described operations (i)-(iii) such protrusion is inserted into the base a position D, longitudinally displaces in direction E, and reaches position F upon application a threshold level of locking force. These operations releasably positioning at least a portion of the second segment of protrusion 118 in recess 250. As would be appreciated by one of skill in the art in view of the description herein, configuring fourth aperture 220 and fourth protrusion 120 may be constructed to comprise similar features and like functionality. Advantageously, embodiments of cover 100 and base 200 also having protrusions (118, 120) and corresponding apertures (218, 220) configured as described herein allow for cover 100 to be releasably coupled to base 200 using operations (i), (ii), and (iii) and locked in place with a plurality of using a single longitudinal motion. Moreover, cover 100 may be decoupled from base 200 using a single, oppositely-directed, longitudinal motion after applying a threshold level of unlocking, oppositely-directed force.

Figure 7:
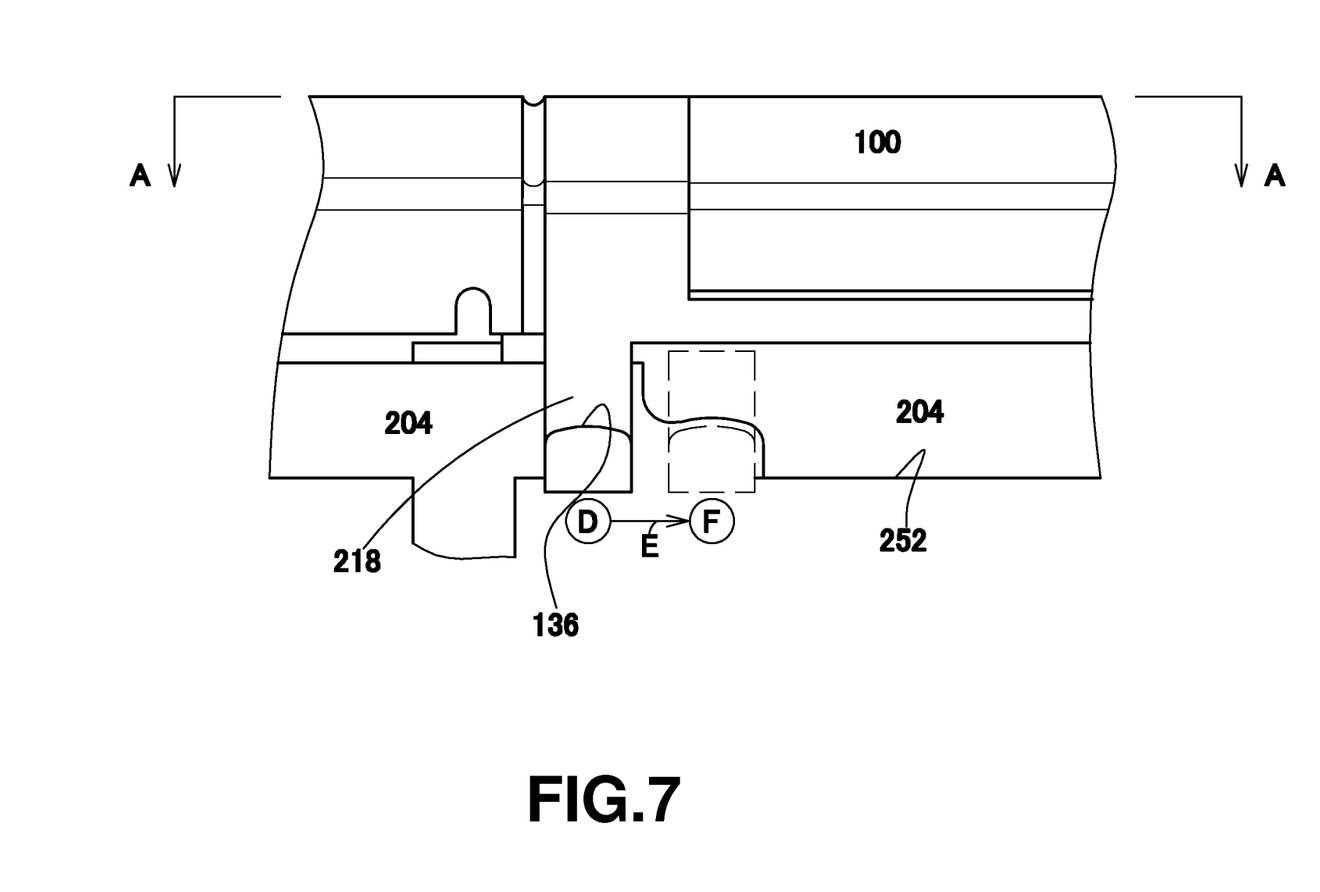
FIG. 7 is a cross-sectional view of a cover protrusion received within a corresponding top plate aperture.

FIG. 7 is a cross-sectional view taken at plane AA (shown in FIG. 4). The figure shows protrusion 118 in position D (solid lines) and in position F (dotted lines) following longitudinal displacement E. As shown in the figure, motion of the arcuate portion 136 of protrusion 118 interferes with the contour of interior top plate surface 252 at the curvilinear 254 contoured segment. Alternatively, the interior surface of the base top plate may have a serpentine-shaped segment that similarly occludes the passage the protrusion contour into the recess. Consequently, these aperture interior surface structures cooperate with the protrusion second segment structure (tab structure) such that application of a locking force deforms and/or displaces one or both of the interfering structures, thereby allowing protrusion 118 to move from position D to reach position F. Application of an oppositely-directed unlocking force allows the protrusion to move from position F to position D. Advantageously, covers configured with such corresponding protrusions and apertures are able to removably couple the switch plate cover the base top plate without the use of fasteners or tools, and lock the cover in place such that a user need deliberately apply a threshold level of force to either couple or decouple the cover from the top plate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. For example, differing numbers of corresponding protrusions and apertures may be positioned on the switch cover and switch base. Similarly, different numbers of locking and/or non-locking corresponding protrusions and apertures may be positioned on the switch cover and switch base. Such other examples are intended to be within the scope of the claims if they have structural elements that do not differ from the literal language of the claims, or if they include equivalent structural elements with insubstantial differences from the literal language of the claims.

What is claimed is:

1. A switch assembly, comprising:
a base having a top plate with a receiving surface; and
a cover having an engagement surface,
wherein the cover further comprises at least one first integral protrusion extending laterally and at least one second integral protrusion extending longitudinally coupled to the cover engagement surface, and
wherein the base top plate further comprises:
at least one first aperture comprising a laterally extending keyway coupled to a first longitudinally extending keyway defining a recess for engaging the at least one first integral protrusion when sliding the cover in the longitudinal direction; and
at least one second aperture comprising a second rectangular longitudinally extending keyway having a length common to the first longitudinally extending keyway and defining a recess for engaging the at least one second integral protrusion when sliding the cover in the longitudinal direction.

2. The switch assembly of claim 1, wherein the at least one first aperture has an L-shape.

3. The switch assembly of claim 1, further comprising at least one other aperture having a square shape.

4. The switch assembly of claim 1, wherein the at least one first integral protrusion further comprises a longitudinal cross-section having an arcuate segment.

5. The switch assembly of claim 1, wherein the base top plate has an interior surface oppositely disposed with respect to the base receiving surface, the interior surface defining an arc wall bounding the at least one aperture.

6. The switch assembly of claim 5, wherein a longitudinal cross-section of the top plate adjacent the at least one first aperture has a curvilinear segment.

7. The switch assembly of claim 5, wherein the arc wall bounding the at least one aperture defines an engagement pocket configured to fixedly receive the at least one cover protrusion.

8. The switch assembly of claim 1, wherein the base further comprises at least one of a passive infra-red (PIR) power switch and an indicator light.

9. The switch assembly of claim 7, wherein the cover further comprises at least one of a light guide portion configured to transmit received infra-red light to the engagement surface and a cover portion configured to transmit visible light received at the engagement surface.

10. The switch assembly of claim 1, further comprising:
a disassembled configuration; and
an assembled configuration wherein the cover is fixedly coupled to the base,
wherein, in the disassembled configuration, the cover engagement surface has a non-planar contour, and
wherein, in the assembled configuration, the cover engagement surface has a contour conforming to the receiving surface contour.

* * * * *